US009880245B2

(12) United States Patent
Kannengiesser

(10) Patent No.: US 9,880,245 B2
(45) Date of Patent: Jan. 30, 2018

(54) METHOD AND MAGNETIC RESONANCE SYSTEM TO ACQUIRE SPECTROSCOPY DATA IN A PREDETERMINED VOLUME SEGMENT OF AN EXAMINATION SUBJECT

(71) Applicant: Siemens Aktiengesellschaft, Munich (DE)

(72) Inventor: Stephan Kannengiesser, Wuppertal (DE)

(73) Assignee: Siemens Aktiengesellschaft, Munich (DE)

( * ) Notice: Subject to any disclaimer, the term of this patent is extended or adjusted under 35 U.S.C. 154(b) by 609 days.

(21) Appl. No.: 14/528,158

(22) Filed: Oct. 30, 2014

(65) Prior Publication Data

US 2015/0115961 A1    Apr. 30, 2015

(30) Foreign Application Priority Data

Oct. 30, 2013    (DE) .................... 10 2013 222 113

(51) Int. Cl.
*G01R 33/54* (2006.01)
*G01R 33/483* (2006.01)
(Continued)

(52) U.S. Cl.
CPC ............. *G01R 33/54* (2013.01); *G01R 33/32* (2013.01); *G01R 33/483* (2013.01);
(Continued)

(58) Field of Classification Search
CPC ...... G01R 33/54; G01R 33/483; G01R 33/32; G01R 33/485; G01R 33/543; G01R 33/56509
See application file for complete search history.

(56) References Cited

U.S. PATENT DOCUMENTS

| | | | | |
|---|---|---|---|---|
| 4,689,568 A | * | 8/1987 | Matsui ................. | G01R 33/485 324/309 |
| 4,878,499 A | * | 11/1989 | Suzuki ................. | G01R 33/283 324/309 |

(Continued)

OTHER PUBLICATIONS

Pineda, et al., Measurement of Hepatic Lipid: High-Speed T2-Corrected Multiecho Acquisition at $^1$H MR Spectroscopy—A Rapid and Accurate Technique, Radiology, vol. 252, No. 2 (2009) pp. 568-578.

(Continued)

*Primary Examiner* — G. M. Hyder
(74) *Attorney, Agent, or Firm* — Schiff Hardin LLP

(57) ABSTRACT

In a method and a magnetic resonance system for acquisition of spectroscopy data in a predetermined volume segment of an examination subject, spectroscopy data in the volume segment are acquired in multiple measurement steps, and spatially resolved MR data of the examination subject also are acquired in multiple measurement steps. Each of the measurement steps to acquire the spectroscopy data or to acquire the MR data respectively includes an excitation step and a readout step associated with that excitation step. At least one of the measurement steps to acquire the MR data occurs between one of the measurement steps to acquire the spectroscopy data and another of the measurement steps to acquire the spectroscopy data.

13 Claims, 5 Drawing Sheets

(51) Int. Cl.
   *G01R 33/485* (2006.01)
   *G01R 33/32* (2006.01)
   *G01R 33/565* (2006.01)

(52) U.S. Cl.
   CPC .......... *G01R 33/485* (2013.01); *G01R 33/543* (2013.01); *G01R 33/56509* (2013.01)

(56) References Cited

U.S. PATENT DOCUMENTS

| | | | | |
|---|---|---|---|---|
| 5,064,638 A | * | 11/1991 | Moore | G01R 33/446 |
| | | | | 324/307 |
| 5,657,757 A | * | 8/1997 | Hurd | G01R 33/4828 |
| | | | | 324/307 |
| 2013/0320979 A1 | * | 12/2013 | Yang | G01R 33/4838 |
| | | | | 324/311 |

OTHER PUBLICATIONS

Thiel et al., "Phase Coherent Averaging in Magnetic Resonance Spectroscopy Using Interleaved Navigator Scans: Compensation of Motion Artifacts and Magnetic Field Instabilities," Magnetic Resonance in Medicine; vol. 47; (2002) pp. 1077-1082.

MacLaren et al., "Prospective Motion Correction in Brain Imaging: A Review"; Magnetic Resonance in Medicine; vol. 69; (2013) pp. 621-636.

Hess et al. "Real-Time Motion and $B_0$ Corrected Single Voxel Spectroscopy Using Volumetric Navigators," Magnetic Resonance in Medicine, vol. 66; (2011) pp. 314-323.

* cited by examiner

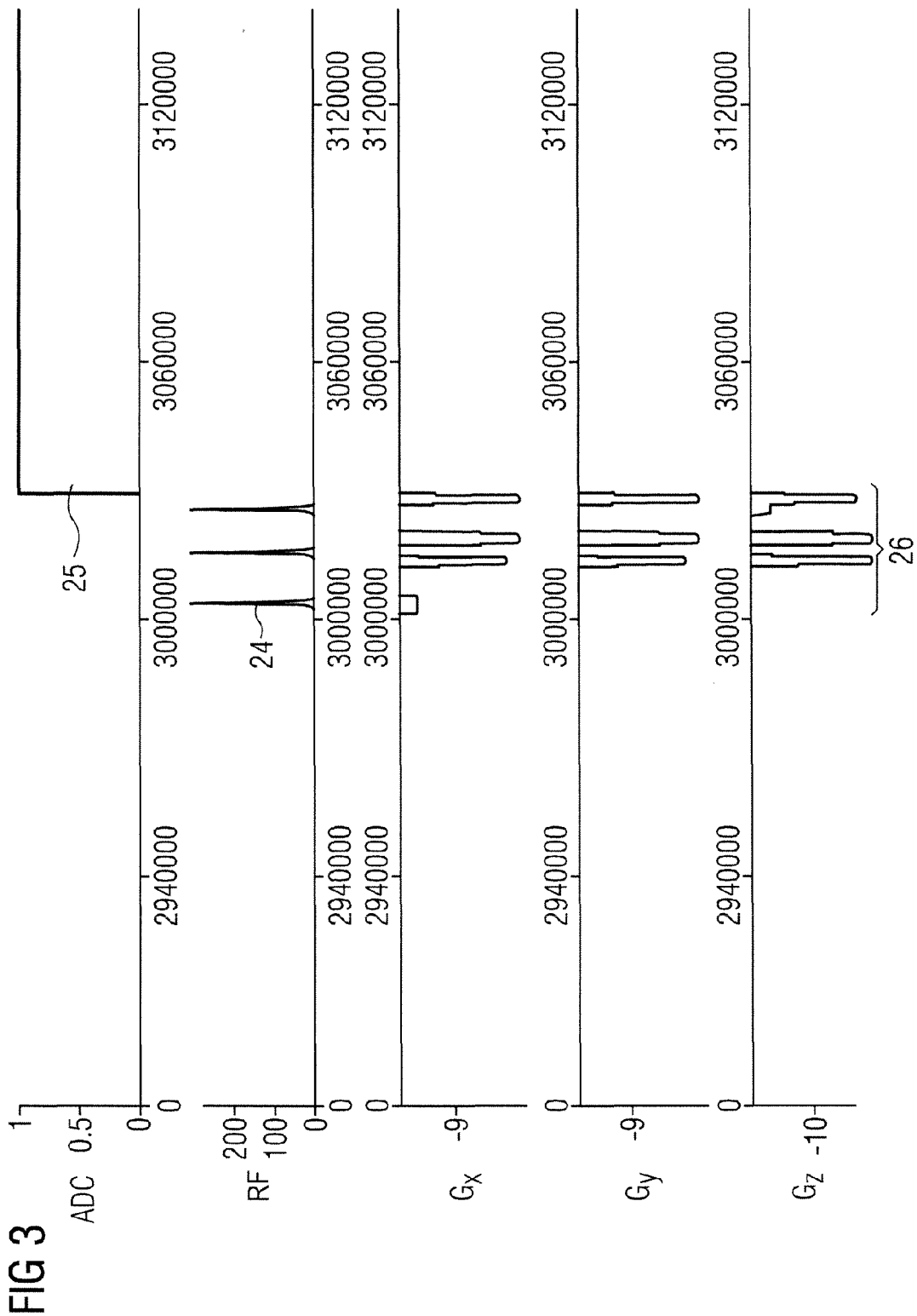

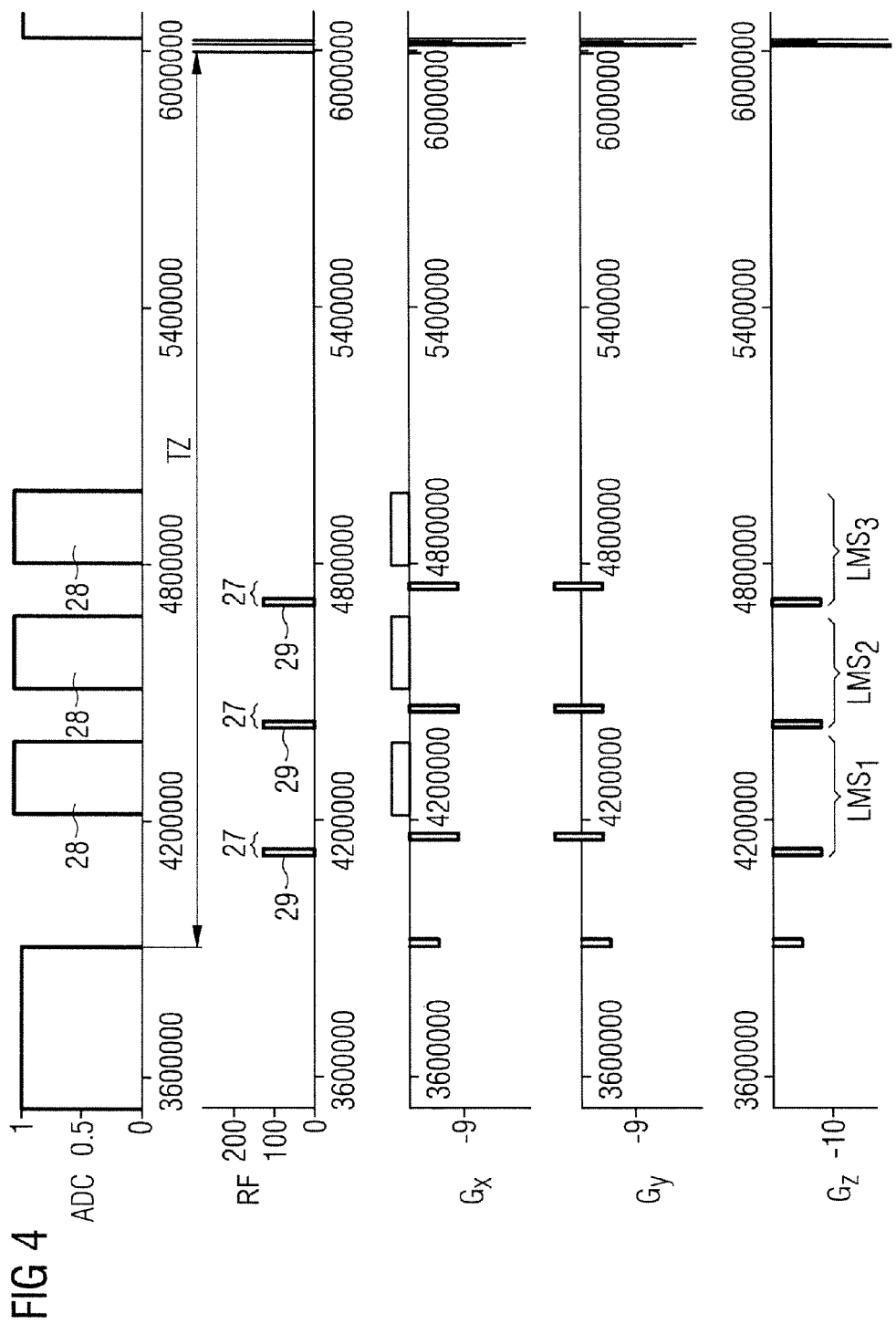

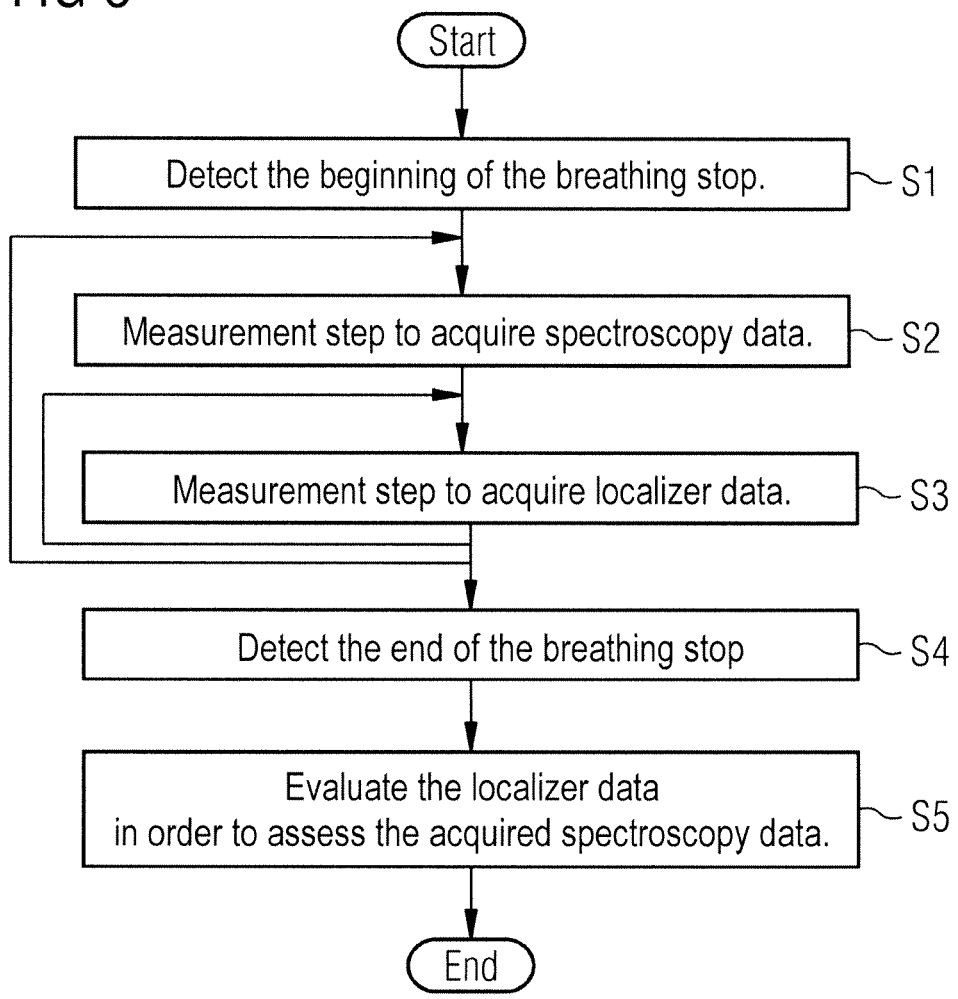

METHOD AND MAGNETIC RESONANCE SYSTEM TO ACQUIRE SPECTROSCOPY DATA IN A PREDETERMINED VOLUME SEGMENT OF AN EXAMINATION SUBJECT

BACKGROUND OF THE INVENTION

Field of the Invention

The present invention concerns a method and a magnetic resonance system in order to acquire spectroscopy data in a predetermined volume segment of an examination subject. As used herein and as commonly understood, spectroscopy data are MR data associated with a respective voxel that allow a frequency spectrum of the corresponding voxel to be shown.

Description of the Prior Art

For diagnostic evaluation of spectroscopy data, the spectroscopy data must be linked with associated anatomical information in order to associate the spectroscopy data with the correct location within the anatomy of the examination subject, or in order to acquire the spectroscopy data at the correct location within the anatomy of the examination subject. For this purpose, a type of MR image known as a localizer image or scan (or just "localizer" for short) is used according to which spatially resolved MR data of the examination subject are acquired in order to achieve an overview about the anatomy of the examination subject, as well as the position of the anatomy and movement of the examination subject.

If the volume segment in which the spectroscopy data are to be acquired moves, such as due to breathing movement of the examination subject, according to the prior art the correct association between the spectroscopy data and the MR data acquired by the localizer is lost, because a movement of the volume segment occurs between the time period in which the spectroscopy data are acquired and the time period in which the MR data for the localizer were acquired.

SUMMARY OF THE INVENTION

An object of the present invention is to improve the association of the spectroscopy data with the associated MR data of the localizer in comparison to the known techniques.

This object is achieved in accordance with the present invention by a method for acquisition of spectroscopy data in a predetermined volume segment of an examination subject with the use of a magnetic resonance (MR) system, wherein the spatially resolved spectroscopy data in the volume segment are acquired in multiple measurement (data acquisition) steps in the operation of the MR system. The spectroscopy data are acquired voxel-by-voxel in these steps, which means that in each of the measurement steps only the spectroscopy data in one voxel are acquired.

Spatially resolved MR data (more precisely MR imaging data) of the examination subject are also acquired in multiple measurement steps. The MR data are acquired as the aforementioned localizer (tool to create an overview image) and serve to assess the spectroscopy data, or to adapt the acquisition of the spectroscopy data using the results of the localizer.

As used herein, a measurement step (both to acquire the spectroscopy data and to acquire the MR data) is an excitation step and a readout step associated with this excitation step. In other words, each measurement step includes an excitation and a readout following that excitation, in which readout the spectroscopy data or MR data produced by the excitation, are read out. Another excitation that occurs following a read out accordingly belongs to a following measurement step. According to the invention, one or more of the measurement steps to acquire the MR data is/are implemented between one of the measurement steps to acquire the spectroscopy data and another of the measurement steps to acquire the spectroscopy data.

A measurement step to acquire the spectroscopy data ends with the readout of the spectroscopy data. However, the next measurement step to acquire the spectroscopy data may not already follow immediately after the end of a measurement step to acquire spectroscopy data, since this next measurement step may begin only if the thermal equilibrium that has been disrupted by the previous measurement step has been reached again within the volume segment. This time period between the beginning of a measurement step to acquire the spectroscopy data and the beginning of the next, following measurement step to acquire the spectroscopy data can amount to multiple seconds and is called a repetition time (TR). The invention is based on the insight that, within this repetition time, measurement steps of the localizer can be implemented without the thermal equilibrium being reached (i.e. without the acquisition of the spectroscopy data being markedly negatively affected or slowed). According to the invention, the repetition time can be extended slightly relative to the prior art in which no MR imaging data are acquired between measurement steps to acquire the spectroscopy data.

Because the measurement steps of the localizer occur between the measurement steps to acquire the spectroscopy data, the acquisition of the spectroscopy data and the acquisition of the MR data for the localizer take place virtually simultaneously, such that the spectroscopy data and the MR data for the localizer are acquired virtually in the same movement phase of the volume segment, the association of the spectroscopy data with the MR data of the localizer is improved relative to a conventional procedure, in which a larger time period occurs between the acquisition of the spectroscopy data and the MR data for the localizer.

In a preferred embodiment of the invention, the following steps are implemented, in the order set forth below, in the same breathing stop of the examination subject:

implement one of the measurement steps to acquire the spectroscopy data;

implement one or more of the measurement steps to acquire the MR data for the localizer;

implement an additional one of the measurement steps to acquire the spectroscopy data.

As used herein, a breathing stop means is a state of the examination subject in which the examination subject holds his or her breath. The method according to the invention advantageously includes a procedure in order to detect or determine whether a breathing stop is present in order to then proceed as described. Naturally, the steps described in the preceding for the embodiment can also be implemented multiple times within the same breathing stop.

Within the scope of the present invention, a method is also provided to acquire spectroscopy data in a predetermined volume segment of an examination subject with a magnetic resonance examination subject. The method includes the following steps of acquiring the spectroscopy data in the volume segment by implementing multiple measurement steps, and acquiring MR data (more precisely MR imaging data) of the examination subject (MR data of the localizer) also by implementing multiple measurement steps, and wherein the MR data also serve for the assessment of spectroscopy data or for adaptation of the acquisition of the spectroscopy data using the results of the MR data.

In the same manner as in the first described embodiment of the method according to the invention, each of the measurement steps includes both a respective excitation step to acquire the spectroscopy data and to acquire the MR data for the localizer, and a readout step associated with the excitation step. In the further embodiment of the method according to the invention, one or more of the measurement steps to acquire the spectroscopy data, and one or more of the measurement steps to acquire the MR data of the localizer, are implemented in the same breathing stop of the examination subject.

According to this further embodiment of the method according to the invention, the following variants are possible:

One or more measurement steps to acquire the MR data of the localizer are implemented before the method steps to acquire the spectroscopy data in the same breathing stop.

One or more measurement steps to acquire the MR data of the localizer are implemented after the method steps to acquire the spectroscopy data in the same breathing stop.

One or more measurement steps to acquire the MR data of the localizer are

Implemented interleaved with the method steps to acquire the spectroscopy data in the same breathing stop. This means that the measurement step or measurement steps to acquire the MR data of the localizer are implemented after one of the measurement steps to acquire the spectroscopy data and before another of the measurement steps to acquire the spectroscopy data in the same breathing stop. Naturally, the measurement steps to acquire the MR data of the localizer are also interleaved with more than two measurement steps to acquire the spectroscopy data.

A combination of the variants described above is also possible.

In both embodiments of the method according to the invention, the predetermined volume segment can be a three-dimensional volume or a slice within the examination subject.

For example, a sequence known as a HISTO (high-speed T2-corrected multiple-echo 1H-MRS sequence) can be used to acquire the spectroscopy data in both methods according to the invention; see "Measurement of Hepatic Lipid: High-Speed T2-Corrected Multi-echo Acquisition at 1H MR Spectroscopy—A Rapid and Accurate Technique", N. Pineda et al., Radiology 252, Page 568 (2009). In particular, the fat in the liver of the examination subject can be quantified with HISTO. For this purpose, the spectroscopy data must be acquired without the acquisition of spectroscopy data from larger blood vessels within the liver from or fat structures outside of the liver being influenced by the contemporaneous acquisition of MR data. Due to the association of the spectroscopy data with the MR data of the localizer that is improved according to the invention, this influencing can be at least detected and possibly even avoided via use of the present invention.

According to the invention, a differentiation is made between spectroscopy data that encode spectral information and MR data (more precisely MR imaging data or MR data of the localizer) that encode spatial information. The spectroscopy data are thereby acquired in particular when no gradient is activated, while the MR data are generally acquired when a gradient is activated. Therefore, normally only the spectroscopy data of one voxel are read out during a readout step, while MR data for multiple k-space points are acquired during a readout step.

The acquisition of the MR data of the localizer serves the following purposes:

The MR data of the localizer serve for the position determination of the acquired spectroscopy data, so quality control is enabled. It is possible to localize the position at which the spectroscopy data are acquired within the examination subject.

In the simplest case, the MR data of the localizer allow a documentation of the actual position of the spectroscopy measurement or, respectively, of the acquired spectroscopy data.

In the event that the spectroscopy data are to be acquired again, the repeat acquisition of the spectroscopy data can be planned using the MR data of the localizer in order to acquire the spectroscopy data more precisely at the desired position within the examination subject.

By definition, a measurement step pair is formed by two measurement steps in chronological succession to acquire the spectroscopy data. The n-th measurement step thereby belongs to the (n−1)-th measurement step pair and to the n-th measurement step pair (N>n>1 with N=number of all measurement steps). For the same breathing stop, one or more of the measurement steps to acquire the MR data advantageously lies between the two measurement steps of each measurement step pair.

Expressed differently, in this embodiment, within the same breathing stop there are no two chronologically successive measurement steps to acquire the spectroscopy data between which is not situated at least one measurement step to acquire the MR data.

According to a preferred embodiment of the invention, all measurement steps that have been implemented during the same breathing stop are considered in order to reconstruct an MR image from the MR data.

In this embodiment, the information that is required to reconstruct an MR image is composed of all MR data that were acquired during the same breathing stop. Expressed differently, it is not (reasonably) possible to reconstruct an MR image if only a portion of the MR data that were acquired during the same breathing stop are used for reconstruction.

In this embodiment, k-space that corresponds to the MR image to be reconstructed is read out (filled with data entries) exactly once within the same breathing stop. For example, within each measurement step pair a portion (defined k-space lines) of k-space that is associated with the measurement step pair is filled, such that the information (the MR data) of all portions of k-space must be present in order to reconstruct the MR image from the MR data.

According to the invention, for each of the measurement steps to acquire the spectroscopy data, a dead time (that is longer than a predetermined time period) exists between an end of the readout step (corresponds to the end of the measurement step) and a beginning of the next following excitation step (corresponds to the beginning of the next following measurement step). One or more of the measurement steps to acquire the MR data of the localizer are implemented during this dead time.

The dead time TZ can be determined using the following Equation (1), depending on the repetition time TR and the implementation time or, respectively, measurement time MZ of a measurement step to acquire the spectroscopy data.

$$TR = TZ + MZ \tag{1}$$

The measurement step or steps to acquire the MR data of the localizer which are implemented between two successive measurement steps to acquire the spectroscopy data are advantageously implemented immediately after the end of the readout step (for example at the latest after ¹/₁₀ of the dead time) of the previously implemented measurement step to acquire the MR data (i.e. at the beginning of the dead time, for example in the first half of the dead time).

The earlier that the measurement step or measurement steps of the localizer are implemented within the dead time, the smaller that a negative influence (due to eddy currents of a gradient of the localizer, for example) on the achievement of the thermal equilibrium at the end of the dead time turns out to be. This in particular assumes that a time interval between the end of the measurement step of the localizer (in the event that only one measurement step lies between spectroscopy data measurement steps) or the end of the last measurement step of the localizer (in the event that multiple measurement steps lie between spectroscopy data measurement steps) and the beginning of the next measurement step to acquire the spectroscopy data is longer than a predetermined minimum time interval. This minimum interval is defined such that all interfering influences that may possibly affect a localizer measurement step have sufficiently decayed at the point of the end of the minimum time interval (beginning of the next measurement step to acquire the spectroscopy data).

In particular, the acquisition of the MR data for the localizer operates with a small flip angle (not larger than 15°).

The flip angle indicates by how large a degree the magnetization is flipped by the RF excitation pulse. A smaller flip angle has a correspondingly smaller disruption of the magnetization, which produces that much smaller a negative influence on the achievement of the thermal equilibrium at the end of the dead time.

In an embodiment of the invention, the MR data of the localizer are acquired in an additional volume segment of the examination subject outside of the predetermined volume segment in which the spectroscopy data are acquired. The additional volume segment is located in proximity to the predetermined volume segment.

If the additional volume segment is not situated within the volume segment, the acquisition of the MR data of the localizer barely interferes with the magnetization within the volume segment, wherein the achievement of the thermal equilibrium at the end of the dead time advantageously is not interfered with by the acquisition of the MR data of the localizer.

The MR data of the localizer are often acquired in three slices arranged respectively orthogonal to one another. These slices thus can represent boundary slices of the volume segment in which the spectroscopy data are acquired.

To acquire the MR data for the localizer, in both methods according to the invention a procedure known as a FLASH (Fast Low Angle Shot) or gre-EPI (Gradient echo, Echo Planar Imaging) can be used, for example.

In another embodiment of the invention, information is generated during the acquisition of the spectroscopy data that can be perceived by the examination subject. Through this information, the examination subject is informed that an acquisition of the spectroscopy data is presently being implemented.

Specific techniques for the acquisition of the spectroscopy data (for example HISTO) have a very low gradient activity, which can barely be perceived by the examination subject. In this case, feedback to the examination subject that spectroscopy data are currently being acquired can be important so that the examination subject maintains the status of the breathing stop as long and consistently as possible.

Within the scope of the present invention, a magnetic resonance system is also provided to acquire spectroscopy data. The magnetic resonance system thereby has a basic field magnet, a gradient field system, one or more RF antennas, and a control device to control the gradient field system and the RF antenna(s), to receive the measurement signals acquired by the RF antenna(s), and to evaluate the measurement signals and acquire the spectroscopy data and MR data. The magnetic resonance system is designed so as to acquire the spectroscopy data in the volume segment by implementing multiple measurement steps and to likewise acquire the MR data for the localizer in multiple measurement steps, in order to evaluate the spectroscopy data using the MR data of the localizer. The magnetic resonance system is designed in order to implement one or more measurement steps to acquire the MR data of the localizer between one of the measurement steps to acquire the spectroscopy data and another of the measurement steps to acquire the spectroscopy data.

Moreover, the present invention also encompasses a magnetic resonance system to acquire spectroscopy data that a basic field magnet, a gradient field system, one or more RF antennas, and a control device to control the gradient field system and the RF antenna(s), to receive measurement signals acquired by the RF antenna(s), and to evaluate the measurement signals and acquire the spectroscopy data and MR data. The magnetic resonance system is designed so as to acquire the spectroscopy data in the volume segment by implementing multiple measurement steps and the MR data for the localizer are likewise acquired in multiple measurement steps, in order to evaluate the spectroscopy data using the MR data of the localizer. The magnetic resonance system is designed in order to execute one or more of the measurement steps to acquire the spectroscopy data, as well as one or more of the measurement steps to acquire the MR data of the localizer, in the same breathing stop of the examination subject.

The advantages of the embodiments of the magnetic resonance system according to the invention correspond to the advantages of the embodiments of the method according to the invention as described above.

The present invention also encompasses a non-transitory, computer-readable data storage medium encoded with programming instructions that, when loaded into a computer of a magnetic resonance apparatus, cause the magnetic resonance apparatus to be operated by the computer in accordance with one or more of the embodiments of the method described above.

The programming instructions can be in source code (for example C++) that must still be compiled and linked or that must merely be interpreted, or in an executable software code that has only still to be loaded into the corresponding computer or control device for execution.

The electronically readable data medium can be, for example, a DVD, a magnetic tape or a USB stick on which is stored electronically readable control information, (see above).

The present invention is particularly suitable for acquisition of spectroscopy data in the abdomen of a breathing examination subject. Naturally, the present invention is not limited to this preferred field of application since the present invention is generally suited to the acquisition of spectroscopy data from moving examination subjects.

BRIEF DESCRIPTION OF THE DRAWINGS

FIG. 3 shows a measurement step according to the invention for the acquisition of spectroscopy data in detail.

FIG. 4 shows measurement steps according to the invention for the acquisition of the MR data of the localizer between two measurement steps according to the invention for acquisition of the spectroscopy data.

In FIG. 5 shows an embodiment according to the invention for the acquisition of spectroscopy data.

DESCRIPTION OF THE PREFERRED EMBODIMENTS

Figure 1:
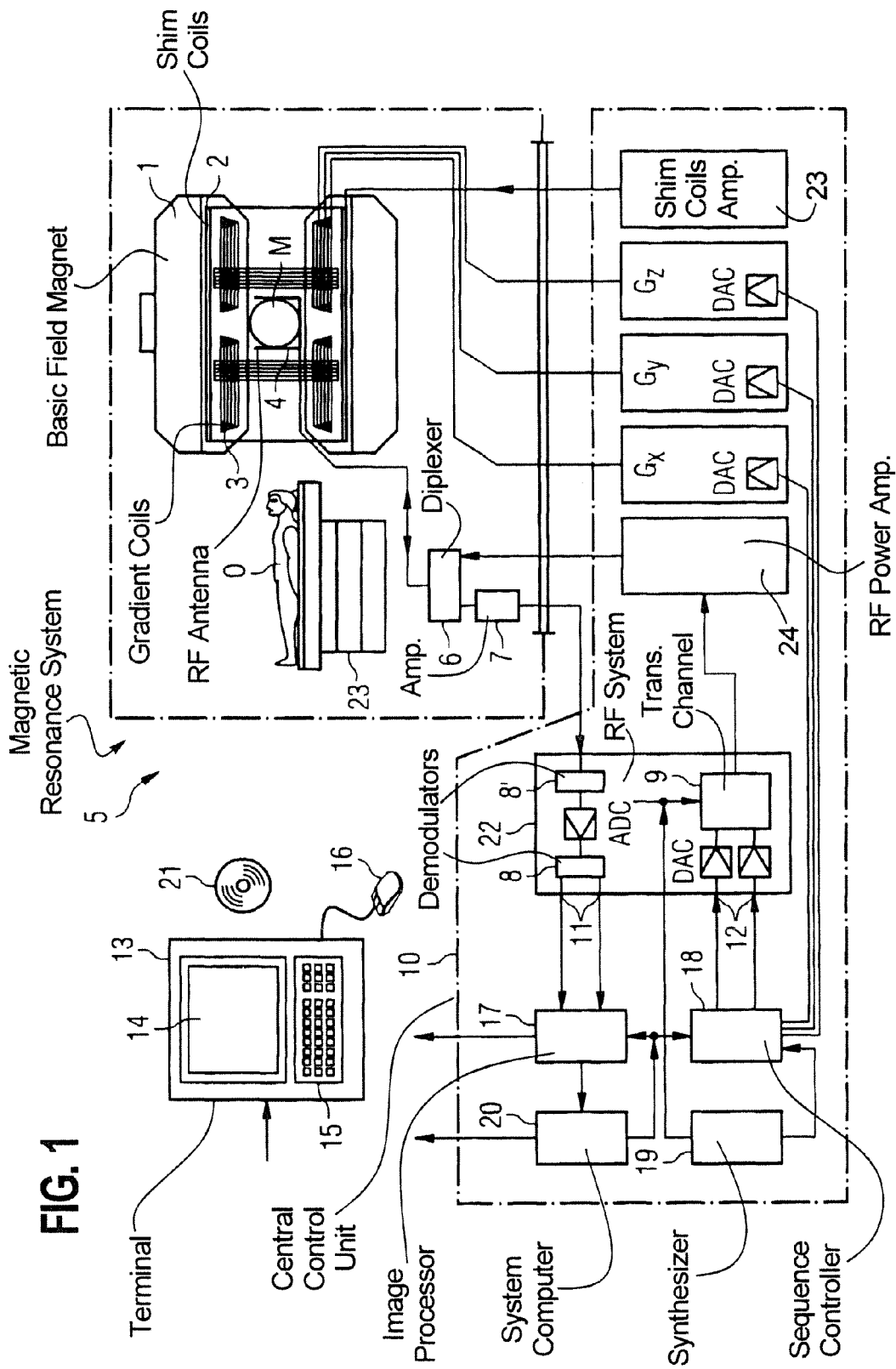
FIG. 1 depicts a magnetic resonance system according to the invention.

FIG. 1 is a schematic depiction of a magnetic resonance system 5 (a magnetic resonance imaging or magnetic resonance tomography apparatus). A basic field magnet 1 generates a temporally constant, strong magnetic field for polarization or alignment of the nuclear spins in an examination region of a subject O, for example of a part of a human body that is to be examined that—lying on a table 23—is slid continuously into the magnetic resonance system 5. The high homogeneity of the basic magnetic field that is required for the nuclear magnetic resonance measurement is defined in a typically spherical measurement volume M, through which the parts of the human body that are to be examined are slid continuously. Shim plates made of ferromagnetic material are attached at suitable points to support the homogeneity requirements, and in particular to eliminate temporally invariable influences. Temporally variable influences are eliminated by shim coils 2 operate by a shim coils amplifier 23.

A cylindrical gradient field system 3 composed of three sub-windings is situated in the basic field magnet 1. Each sub-winding is supplied with current by an amplifier to generate a linear (also temporally variable) gradient magnetic field in the respective directions of a Cartesian coordinate system. The first sub-winding of the gradient field system 3 thereby generates a gradient $G_x$ in the x-direction, the second sub-winding generates a gradient $G_y$ in the y-direction, and the third sub-winding generates a gradient $G_z$ in the z-direction. Each amplifier includes a digital/analog converter that is activated by a sequence controller 18 for accurately-timed generation of gradient pulses.

Situated within the gradient field system 3 are one or more radio-frequency antennas 4 that convert the radio-frequency pulses emitted by a radio-frequency power amplifier 24 into an alternating magnetic field for excitation of the nuclei and alignment of the nuclear spins of the subject O to be examined, or of the region of the subject O that is to be examined. Each radio-frequency antenna 4 has one or more RF transmission coils and one or more RF reception coils in the form of an annular (pre(erably linear or matrix-like) arrangement of component coils. The alternating field emanating from the precessing nuclear spins—normally the nuclear spin echo signals caused by a pulse sequence composed of one or more radio-frequency pulses and one or more gradient pulses—is also converted by the RF reception coils of the respective radio-frequency antenna 4 into a voltage (measurement signal) which is supplied via an amplifier 7 to a radio-frequency reception channel 8 of a radio-frequency system 22. The radio-frequency system 22, which is part of a control device 10 of the magnetic resonance system 5, furthermore has a transmission channel 9 in which the radio-frequency pulses are generated for the excitation of the nuclear magnetic resonance. The respective radio-frequency pulses are digitally represented in the sequence controller as a series of complex numbers based on a pulse sequence provided by the system computer 20. This number sequence is supplied as a real part and an imaginary part to a digital/analog converter in the radio-frequency system 22 via respective inputs 12, and from the digital/analog converter to the transmission channel 9. In the transmission channel 9, the pulse sequences are modulated on a radio-frequency carrier signal whose base frequency corresponds to the resonance frequency of the nuclear spins in the measurement volume.

Switching from transmission operation to reception operation takes place via a transmission/reception diplexer 6. The RF transmission coils of the radio-frequency antenna(s) 4 radiate(s) the radio-frequency pulses for excitation of the nuclear spins into the measurement volume M and scans resulting echo signals via the RF reception coil(s). The correspondingly acquired magnetic resonance signals are phase-sensitively demodulated to an intermediate frequency in a reception channel 8' (first demodulator) of the radio-frequency system 22, digitized in an analog/digital converter (ADC) and output via the output 11. This signal is further demodulated to a frequency of zero. The demodulation to a frequency of zero and the separation into real part and imaginary part occurs in a second demodulator 8 after the digitization in the digital domain. An MR image or a spectroscopy information is reconstructed by an image computer 17 from the measurement data obtained in such a manner via an output 11. The administration of the measurement data, the image data and the control programs takes place via the system computer 20. Based on a specification with control programs, the sequence controller 18 monitors the generation of the respective desired pulse sequences and the corresponding scanning of k-space. In particular, the sequence controller 18 thereby controls the accurately-timed switching of the gradients, the emission of the radio-frequency pulses with defined phase amplitude, and the reception of the magnetic resonance signals. The time base for the radio-frequency system 22 and the sequence controller 18 is provided by a synthesizer 19. The selection of corresponding control programs to generate a spectroscopy information or an MR image, and the presentation of the obtained frequency spectrum or of the generated MR image, take place via a terminal 13 that has a keyboard 15, a mouse 16 and a monitor 14.

Figure 2:
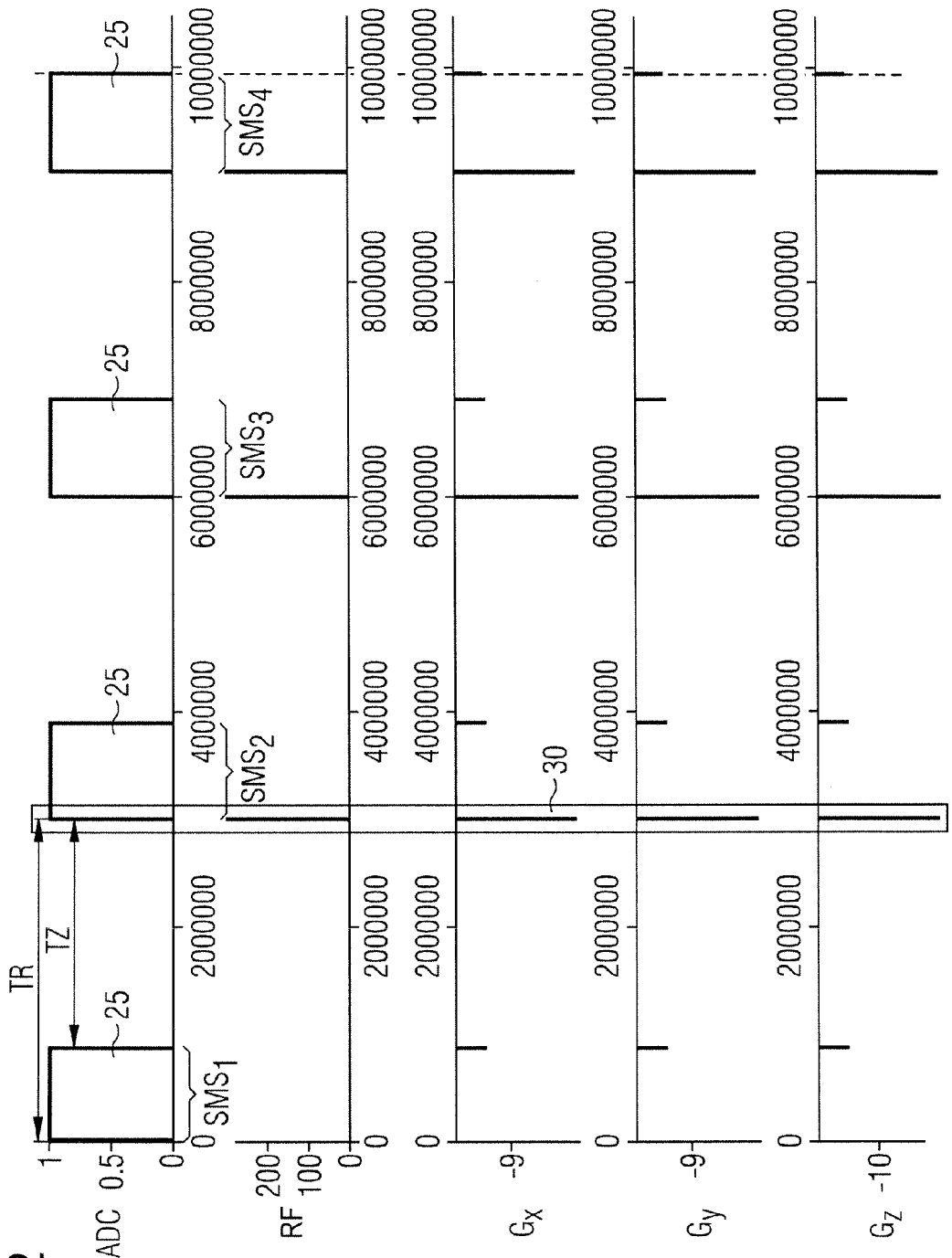
FIG. 2 shows measurement steps according to the invention for the acquisition of spectroscopy data.

Multiple measurement steps $SMS_1$-$SMS_4$ to acquire spectroscopy data according to the present invention are shown in FIG. 2. It can be seen that a dead time TZ extends between the end of the first measurement step $SMS_1$ and the beginning of the second measurement step $SMS_2$, such that the repetition time TR is composed of the sum of the measurement time (duration of a measurement step) and the dead time TZ. The repetition time TR is thereby normally constant and thus applies to all measurement steps $SMS_1$-$SMS_4$.

Each measurement step $SMS_1$-$SMS_4$ includes an excitation step (not shown in detail in FIG. 2) and a readout step 25 (here depicted as a time period in which an analog/digital converter ADC is active). A defined time region which is presented in detail in FIG. 3 is marked with the reference character 30 in FIG. 2.

The time period marked with the reference character 30 in FIG. 2 is shown in detail in FIG. 3. It is apparent that the excitation step 26 of each measurement step $SMS_1$-$SMS_4$ includes three RF pulses 24 and gradients which are switched in each spatial direction (Gx, Gy, Gz). A voxel is thereby excited, and the magnetic resonance signal within this voxel is read out in the readout step 25 in the absence of any gradient.

The time period or, respectively, dead time TZ between the second measurement step SMS$_2$ and the third measurement step SMS$_3$ (see FIG. 2) is shown in detail in FIG. 4. At the beginning of this dead time TZ, three measurement steps LMS$_1$-LMS$_3$ are executed to acquire localizer MR data. The excitation step 27 of each of these measurement steps LMS$_1$-LMS$_3$ includes an RF excitation pulse with a flip angle of 5°. Gradients are subsequently switched for spatial coding, and one k-space line along the X-direction is respectively read out per measurement step LMS$_1$-LMS$_3$ in the readout step 28, which is apparent using the gradient Gx switched during the readout step 28. The sequence shown in FIG. 4 for acquisition of the MR data of the localizer is a gradient echo sequence.

A procedure to acquire spectroscopy data is shown in FIG. 5. As soon as the beginning of a breathing stop of the examination subject is detected in step S1, in step S2 the first measurement step is implemented to acquire the spectroscopy data. At the end of this measurement step, multiple measurement steps to acquire localizer MR data are implemented within the dead time—in that step S3 is implemented multiple times—until the beginning of the next measurement step to acquire the spectroscopy data. The next measurement step to acquire the spectroscopy data is subsequently implemented in the recursively traversed step S2, which can in turn be followed by measurement steps to acquire localizer MR data.

As soon as the end of the breathing stop is detected in step S4, measurement steps to acquire spectroscopy data or localizer MR data are no longer implemented. In step S5, the localizer MR data are evaluated in order to assess the quality of the acquired spectroscopy data using this evaluation.

In step S1 and in step S4, the beginning or the end of the breathing stop, in addition to the evaluation of special MR data acquired for this purpose, can also be detected using a breathing belt, or simply using a periodic signal or a signal output by an operator.

Although modifications and changes may be suggested by those skilled in the art, it is the intention of the inventor to embody within the patent warranted hereon all changes and modifications as reasonably and properly come within the scope of his contribution to the art.

I claim as my invention:

1. A method for acquiring spectroscopy data in a predetermined volume segment of an examination subject, comprising:
    operating a magnetic resonance (MR) apparatus, in which an examination subject is situated, to acquire spectroscopy data in a predetermined volume segment of the subject in a plurality of spectroscopy data measurement steps and;
    operating said MR apparatus to acquire MR data from the examination subject that originate from at least an additional volume segment that is outside of, and adjacent to, said predetermined volume segment, in a plurality of MR data measurement steps that are different from said spectroscopy data measurement steps;
    operating said MR apparatus in each of said spectroscopy data measurement steps and in each of said MR data measurement steps to include an excitation of nuclear spins in the predetermined volume segment and an associated readout of signals produced by nuclear spins excited in the associated excitation;
    operating the MR apparatus by implementing at least one of said MR data measurement steps between one of said spectroscopy data measurement steps and another of said spectroscopy data measurement steps; and
    providing the MR data and the spectroscopy data to a computer and, in said computer, generating respective data files of the spectroscopy data and the MR data and making the data files available in electronic form at an output of the computer.

2. A method as claimed in claim 1 comprising instructing the examination subject to implement a breathing stop and, in said breathing stop, operating said MR apparatus to implement, in the following order:
    one of said spectroscopy data measurement steps;
    one of said MR data measurement steps; and
    another one of said spectroscopy data measurement steps.

3. A method as claimed in claim 1 comprising:
    grouping said spectroscopy data measurement steps into a plurality of spectroscopy data measurement step pairs, each formed by two chronologically adjacent spectroscopy data measurement steps; and
    operating said MR apparatus to implement at least one MR data measurement step between the two spectroscopy data measurement steps in each pair within a same breathing stop executed by the examination subject.

4. A method as claimed in claim 1 comprising, in said computer, reconstructing an MR image only from all MR data measurement steps implemented during a same breathing stop executed by the examination subject.

5. A method as claimed in claim 1 comprising:
    operating said MR apparatus in each of said spectroscopy data measurement steps to include a dead time that is longer than a predetermined time period that occurs between an end of a readout and a beginning of a next-following excitation; and
    implementing at least one of said MR data measurement steps during said dead time.

6. A method as claimed in claim 5 comprising operating said MR apparatus to implement at least one said MR data measurement steps immediately after an end of the readout of a preceding one of said spectroscopy data measurement steps.

7. A method as claimed in claim 1 comprising operating said MR apparatus to implement each of said MR data measurement steps with a flip angle, in said excitation, of not more than 15°.

8. A method as claimed in claim 1 comprising generating information perceptible by the examination subject during implementation of said spectroscopy data measurement steps that inform the examination subject that spectroscopy data are being acquired.

9. A method for acquiring spectroscopy data in a predetermined volume segment of an examination subject, comprising:
    operating a magnetic resonance (MR) apparatus, in which an examination subject is situated, to acquire spectroscopy data in a predetermined volume segment of the subject in a plurality of spectroscopy data measurement steps;
    operating said MR apparatus to acquire MR data from the examination subject that originate from at least an additional volume segment that is outside of, and adjacent to, said predetermined volume segment, in a plurality of MR data measurement steps that are different from said spectroscopy data measurement steps;
    operating said MR apparatus in each of said spectroscopy data measurement steps and in each of said MR data measurement steps to include an excitation of nuclear spins in the predetermined volume segment and an associated readout of signals produced by nuclear spins excited in the associated excitation;

instructing the examination subject to execute a breathing stop, and operating said MR apparatus to implement at least one of said spectroscopy data measurement steps and at least one of said MR data measurement steps during said breathing stop; and providing the MR data and the spectroscopy data to a computer and, in said computer, generating respective data files of the spectroscopy data and the MR data and making the data files available in electronic form at an output of the computer.

10. A magnetic resonance (MR) apparatus for acquiring spectroscopy data in a predetermined volume segment of an examination subject, comprising:

an MR data acquisition unit;

a control unit configured to operate said MR data acquisition unit, with an examination subject situated therein, to acquire spectroscopy data in a predetermined volume segment of the subject in a plurality of spectroscopy data measurement steps;

said control unit being configured to operate said MR data acquisition unit to acquire MR data from the examination subject that originate from at least an additional volume segment that is outside of, and adjacent to, said predetermined volume segment, in a plurality of MR data measurement steps that are different from said spectroscopy data measurement steps;

said control unit being configured to operate said MR data acquisition unit in each of said spectroscopy data measurement steps and in each of said MR data measurement steps to include an excitation of nuclear spins in the predetermined volume segment and an associated readout of signals produced by nuclear spins excited in the associated excitation;

said control unit being configured to operate the MR data acquisition unit by implementing at least one of said MR data measurement steps between one of said spectroscopy data measurement steps and another of said spectroscopy data measurement steps; and a computer provided with the MR data and the spectroscopy data, said computer being configured to generate respective data files of the spectroscopy data and the MR data and to make the data files available in electronic form at an output of the computer.

11. A magnetic resonance (MR) apparatus for acquiring spectroscopy data in a predetermined volume segment of an examination subject, comprising:

an MR data acquisition unit;

a control unit configured to operate said MR data acquisition unit, with an examination subject situated therein, to acquire spectroscopy data in a predetermined volume segment of the subject in a plurality of spectroscopy data measurement steps;

said control unit being configured to operate said MR data acquisition unit to acquire MR data from the examination subject that originate from at least an additional volume segment that is outside of, and adjacent to, said predetermined volume segment, in a plurality of MR data measurement steps that are different from said spectroscopy data measurement steps;

said control unit being configured to operate said MR data acquisition unit in each of said spectroscopy data measurement steps and in each of said MR data measurement steps to include an excitation of nuclear spins in the predetermined volume segment and an associated readout of signals produced by nuclear spins excited in the associated excitation;

said control unit being configured to operate said MR data acquisition unit to implement at least one of said spectroscopy data measurement steps and at least one of said MR data measurement steps during a breathing stop that the examination subject has been instructed to make; and a computer provided with the MR data and the spectroscopy data, said computer being configured to generate respective data files of the spectroscopy data the MR data and to make the data files available in electronic form at an output of the computer.

12. A non-transitory, computer-readable data storage medium encoded with programming instructions, said storage medium being loaded into a computer of a magnetic resonance (MR) apparatus, and said programming instructions causing said computer to:

operate said MR apparatus, with an examination subject situated therein, to acquire spectroscopy data in a predetermined volume segment of the subject in a plurality of spectroscopy data measurement steps;

operate said MR apparatus to acquire MR data from the examination subject that originate from at least an additional volume segment that is outside of, and adjacent to, said predetermined volume segment, in plurality of MR data measurement steps that are different from said spectroscopy data measurement steps;

operate said MR apparatus in each of said spectroscopy data measurement steps and in each of said MR data measurement steps to include an excitation of nuclear spins in the predetermined volume segment and an associated readout of signals produced by nuclear spins excited in the associated excitation;

operate the MR apparatus by implementing at least one of said MR data measurement steps between one of said spectroscopy data measurement steps and another of said spectroscopy data measurement steps; and generate respective data files of the spectroscopy data and the MR data and making the data files available in electronic form at an output of the computer.

13. A non-transitory, computer-readable data storage medium encoded with programming instructions, said storage medium being loaded into a computer of a magnetic resonance (MR) apparatus, and said programming instructions causing said computer to:

operate said MR apparatus, with an examination subject situated therein, to acquire spectroscopy data in a predetermined volume segment of the subject in a plurality of spectroscopy data measurement steps;

operate said MR apparatus to acquire MR data from the examination subject that originate from at least an additional volume segment that is outside of, and adjacent to, said predetermined volume segment, in a plurality of MR data measurement steps that are different from said spectroscopy data measurement steps;

operate said MR apparatus in each of said spectroscopy data measurement steps and in each of said MR data measurement steps to include an excitation of nuclear spins in the predetermined volume segment and an associated readout of signals produced by nuclear spins excited in the associated excitation;

operate said MR apparatus to implement at least one of said spectroscopy data measurement steps and at least one of said MR data measurement steps during a breathing stop that the examination subject has been instructed to make; and generate respective data files of the spectroscopy data and the MR data and making the data files available in electronic form at an output of the computer.

\* \* \* \* \*